United States Patent
Nakagawa et al.

[11] Patent Number: 5,366,849
[45] Date of Patent: Nov. 22, 1994

[54] PHOTORESIST PATTERN FORMATION THROUGH ETCHING WHERE THE IMAGING EXPOSURE CHANGES IN A GIVEN DIRECTION IN THE DESIRED PATTERN AND INCLINED VAPOR DEPOSITION IS UTILIZED TO DEPOSIT A FILM

[75] Inventors: Yoshikazu Nakagawa; Masayuki Sonobe, both of Kyoto, Japan

[73] Assignee: Rohm Co., Ltd., Kyoto, Japan

[21] Appl. No.: 978,263

[22] Filed: Nov. 18, 1992

[30] Foreign Application Priority Data

Jan. 27, 1992 [JP] Japan ................. 4-037203

[51] Int. Cl.$^5$ ............................... G03C 5/58
[52] U.S. Cl. ................. 430/314; 430/313; 430/315; 430/323; 430/324; 437/228
[58] Field of Search ............... 430/313, 314, 315, 322, 430/324, 323; 437/228

[56] References Cited
U.S. PATENT DOCUMENTS 4,935,334  6/1990  Boettiger et al. ............. 430/322
5,126,288  6/1992  Nakagawa ..................... 437/228

FOREIGN PATENT DOCUMENTS 3-245527  11/1991  Japan .

*Primary Examiner*—Charles L. Bowers, Jr.
*Assistant Examiner*—Christopher G. Young
*Attorney, Agent, or Firm*—Brumbaugh, Graves, Donohue & Raymond

[57] ABSTRACT

The fine pattern processing method comprises an exposure step for forming a resist pattern having a predetermined opening on a substrate, a vapor deposition step for forming a vapor deposited film on a portion of the substrate which is exposed at the opening by performing an inclined vapor deposition over the resist pattern, and an etching step for performing the etching treatment with use of the vapor deposited film as a mask. In the exposure step, the exposure time of the photoresist is continuously varied within the wafer plane in relation to the continuous changes in the vapor deposition angles within the wafer plane during the inclined vapor deposition, so that the taper angle of the resist pattern is changed. In other words, the exposure time is shortened at the region where the vapor deposition angle is small so as to increase the taper angle of the resist pattern, whereas the exposure time is prolonged at the region where the vapor deposition angle is large in order that the taper angle is decreased.

4 Claims, 5 Drawing Sheets

DEPOSITION ANGLE θa
EXPOSURE TIME Ta

DEPOSITION ANGLE θb
EXPOSURE TIME Tb

DEPOSITION ANGLE θc
EXPOSURE TIME Tc ( $\theta_a < \theta_b < \theta_c$ , $T_a < T_b < T_c$ )

PHOTORESIST PATTERN FORMATION THROUGH ETCHING WHERE THE IMAGING EXPOSURE CHANGES IN A GIVEN DIRECTION IN THE DESIRED PATTERN AND INCLINED VAPOR DEPOSITION IS UTILIZED TO DEPOSIT A FILM

BACKGROUND OF THE INVENTION

The present invention relates to a fine processing method of a semiconductor device, which is utilized, for example, to form a gate of a compound semiconductor device such as a MESFET (Metal Semiconductor Junction FET) and an HEMT (High Electron Mobility Transistor).

In the semiconductor devices such as a MESFET and an HEMT mainly used in a microwave band, a very short gate less than, e.g., 0.5 $\mu$m is employed. To this end, such a fine resist pattern whose pattern width is below 0.5 $\mu$m must be formed in the lithographic step. Since it is difficult in the normal photo exposing method to form such a fine resist pattern due to a limitation in the wavelength of the exposure light, the electron beam exposing method or the focus ion beam method has been conventionally employed.

However, there are problems in these conventional exposing methods that the lengthy exposure time is necessarily required and the productivities of the semiconductor device are deteriorated. Accordingly, a fine processing method capable of easily forming the fine pattern has been proposed (Japanese Patent Application No. Hei. 2-42857 filed by the same assignee of the present application and published on Nov. 1, 1991 under Japanese Patent Unexamined Publication No. Hei. 3-245527).

In this fine processing method, a resist pattern having a predetermined opening is formed on a substrate, a vapor deposited film is formed on a portion of the substrate which is exposed at the opening by performing an inclined vapor deposition on this resist pattern, and this vapor deposited film is used as a mask so as to execute an etching treatment.

In accordance with this fine processing method, the vapor deposition to the substrate which is exposed at the opening of the resist pattern, can be partially shielded by the resist pattern by selecting, for instance, the vapor deposition angle with regard to the resist pattern and the film thickness of the resist pattern when the inclined vapor deposition is carried out. As a result, since both the portion on which the vapor deposited film has been formed, and the portion on which no vapor deposited film is formed are fabricated on the substrate exposed at the opening of the resist pattern, the fine groove (pattern) is formed only on the portion on which no vapor deposited film is formed if the etching process is carried out.

Although the previously proposed fine processing method is a useful processing method capable of easily obtaining a pattern whose width is narrower than a width of another pattern obtained by the conventional photoexposure method, there are the following problems to be solved. These problems will now be explained with reference to FIGS. 6 and 7.

As represented in FIG. 6, a vapor deposition angle within a single wafer "W" is continuously varied according to positions on this wafer since metal particles to form a vapor deposited film are emitted from a vapor deposition source "P" in a radial form. For instance, the vapor deposition angle is continuously changed from 3°–5°–7° over one end of the wafer W, a central part thereof, and the other end thereof.

As shown in FIG. 7, since the vapor deposition angle is changed within the wafer "W", widths of the exposed region 4 of the substrate from the edge portion of the resist pattern 2 formed on the substrate 1 to the edge portion of the vapor deposited film 3 on the substrate 1, are varied in accordance with the vapor deposition angles. For example, in case of the resist pattern 2 having the width of 1.5 $\mu$m, the widths of the exposed region 4 are varied as follows. If the vapor deposition angle is 3°, then the width of the exposed region 4 of the substrate is 0.079 $\mu$m. If the vapor deposition angle is 5°, then the width of this exposed region 4 is 0.131 $\mu$m. If the vapor deposition angle is 7°, then the width of this exposed region 4 is 0.184 $\mu$m.

Such a variation in the widths of the exposed region 4 of the substrate appears as a variation in a gate length. As a consequence, according to the previously proposed fine processing method, since the gate length is varied due to the continuous variation in the vapor deposition angle within the same wafer, there is a problem that fluctuation exists in the performance of the semiconductor device.

SUMMARY OF THE INVENTION

The present invention has been made in an attempt to solve the above-described problem, and therefore, has an object to provide a fine processing method capable of easily forming a fine pattern, the fluctuation of the width of which is suppressed, by compensating the continuous variation in the vapor deposition angle.

To achieve the above-explained object, the present inventors have paid attentions to such a fact that a certain sort of photoresist (for instance, an image reversive designed positive type photoresist for manufacturing a VLSI) has a reversed taper shaped section of resist pattern, and the taper angles are dependent on the exposure time. In other words, although the widths of the exposed region 4 of the substrate are reduced in accordance with a decrease of the vapor deposition angle during the execution of the inclined vapor deposition, when the exposure time is changed in such a manner that the taper angle of the resist pattern is increased in accordance with such a decrease of the vapor deposition angle, the widths of the exposed region 4 of the substrate are expanded by values determined by increasing the taper angle. As a consequence, the variations in the pattern widths caused by the changes in the vapor deposition angle can be compensated.

Accordingly, a fine processing method according to the present invention comprises: a photo exposure step for forming a resist pattern having a predetermined opening on a substrate; a vapor deposition step for forming a vapor deposited film on a portion of the substrate exposed at the opening by performing an inclined vapor deposition on the resist pattern; and an etching step for executing an etching treatment with use of the vapor deposited film as a mask, wherein in the exposure step, in relation to a continuous change in a vapor deposition angle within a wafer plane during the inclined vapor deposition, exposure time of a photoresist is continuously changed within the wafer plane to vary a taper angle of the resist pattern.

The effect of the present invention is as follows.

That is, since in relation to the continuous variation of the vapor deposition angle within the wafer during the inclined vapor deposition, the exposure time of the photoresist is continuously varied within the wafer plane in accordance with the present invention, so as to vary the taper angle of the resist pattern, the variations in the pattern widths in connection with the variations in the vapor deposition angle can be compensated.

DETAILED DESCRIPTION OF THE INVENTION

Referring now to drawings, an embodiment of the present invention will be explained.

FIGS. 1(a) to 1(f) are sectional views of an element structure at the respective steps of the fine processing method according to one embodiment of the present invention.

Figure 1A:
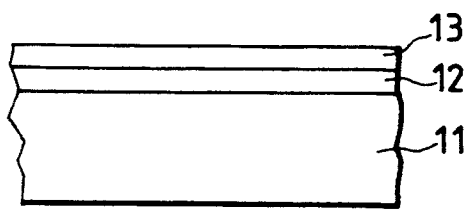
FIGS. 1(a) to 1(f) are sectional views for representing a sequence of the fine processing method according to one preferred embodiment of the present invention.

FIG. 1(a) will now be referred. An SiON layer 12 and an SiN layer 13 are sequentially stacked on a GaAs substrate 11.

Figure 1B:
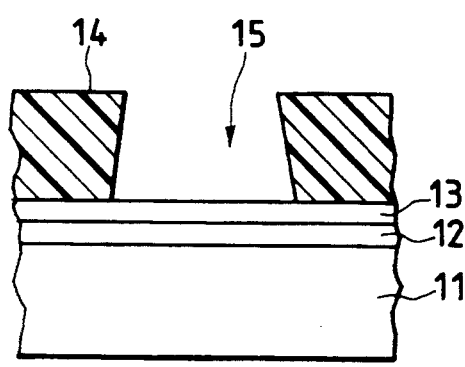

FIG. 1(b) will now be referred. A resist pattern 14 having a predetermined opening 15 is formed on the SiN layer 13. As shown in FIG. 1(b), a sectional shape of the resist pattern 14 is a reversed taper. As will be explained later, the exposure time of the photoresist is changed in order that this taper angle is varied in relation with the continuous change in the vapor deposition angle of the inclined vapor deposition. A detailed description about this exposure step will be made later.

Figure 1C:
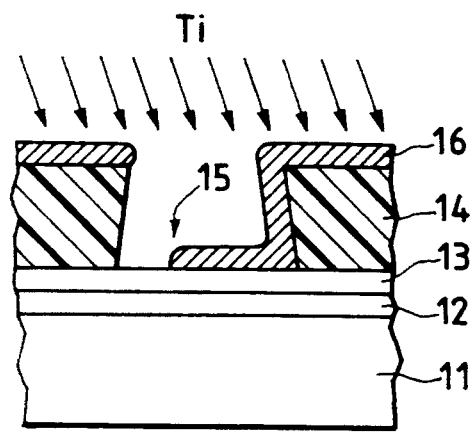

FIG. 1(c) will now be referred. For instance, the inclined vapor deposition of Ti is carried out over the resist pattern 14. As a result, both of the resist pattern 14 and a portion of the SiN layer 13 exposed at the opening 15 are covered with a Ti film 16. In FIG. 1(c), since the vapor deposition is performed from the left side, some range of the opening 15 near the edge portion of the left side of the resist pattern 14 is not covered by the Ti film 16 and therefore uncovered region is left. The range of the opening which has not been covered by the Ti film 16 and remains uncovered, is varied in accordance with the angle of the inclined vapor deposition and the film thickness of the resist pattern 14.

Figure 1D:
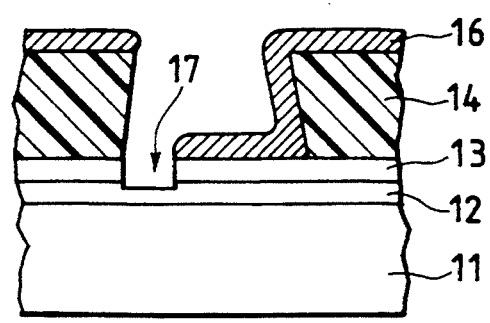

FIG. 1(d) will now be referred. The Ti film 16 is used as a mask to perform an etching treatment. The etching process is carried out by the reaction ion etching (RIE) with employment of a fluorine gas (CF$_6$, CHF$_3$, SF$_6$ etc.). As a result, a groove 17 having a dimension substantially equal to the range uncovered by the Ti film 16, is formed in the SiN layer 13.

Figure 1E:
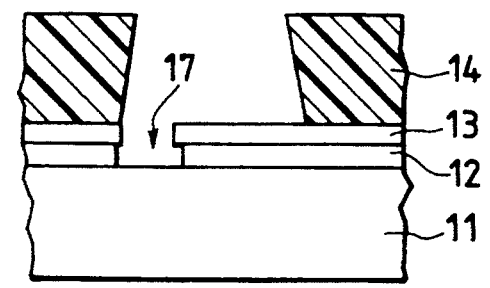

FIG. 1(e) will now be referred. The Ti film 16 is removed by way of the etching process with employment of hydrogen fluoride, and the SiON layer 12 is etched with using the SiN layer 13 as a mask. It should be noted that according to this preferred embodiment, the side etching process of the SiON layer 12 is performed in order that the groove 17 can be applied to form a gate.

Figure 1F:
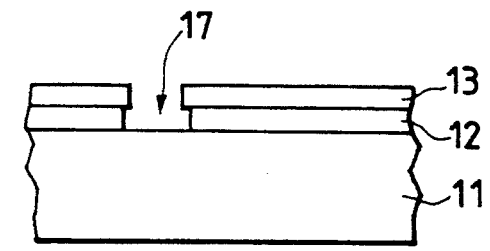

FIG. 1(f) will now be referred. The formation of the fine groove 17 to expose the GaAs substrate 11 is accomplished by removing the resist pattern 14 by way of the normal removing method.

Various fine processes may be performed to the GaAs substrate 11 via the thus formed groove 17. For instance, when the gate metal is vapor-deposited via the groove 17 on the GaAs substrate in a vertical direction, a very fine gate electrode can be formed on the GaAs substrate 11, as compared with the gate electrode manufactured by the conventional photo exposing method. Also, an ion may be injected into the fine region of the GaAs substrate 11 with utilizing the groove 17.

Referring now to FIGS. 2(a) to 2(d), the exposure step shown in FIG. 1(b) will be explained more in detail.

The photoresist used in this preferred embodiment is known as the image reversible designed positive type photoresist for manufacturing the VLSI, for instance, a series of AZ5200E supplied from Hoechst corporation. This photoresist 14a is coated on the GaAs substrate 11, a region corresponding to the opening 15 is masked to perform a low ultraviolet (UV) irradiation [see FIG. 2(a)]. Subsequently, the resist region irradiated by the low ultraviolet is cured by baking the wafer (see FIG. 2b). Next, an overall wafer is exposed to light [see FIG. 2(c)]. When the entirely exposed wafer is developed, the resist pattern 14, the opening part 15 of which has been formed in a reverse taper, is obtained [see FIG. 2(d)].

Figure 2A:
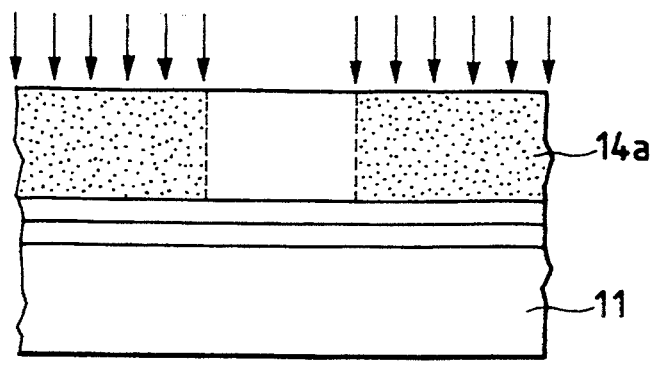
FIGS. 2(a) to 2(d) are sectional views for showing the detailed sequence of the exposure step.
Figure 2B:
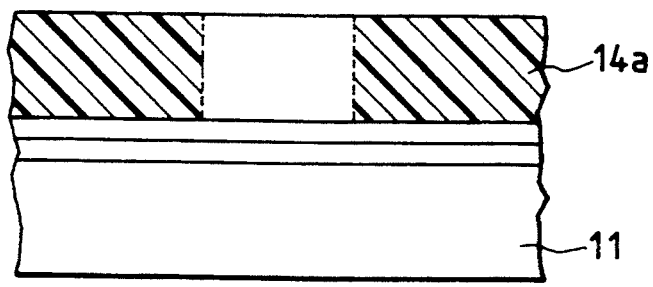
Figure 3:
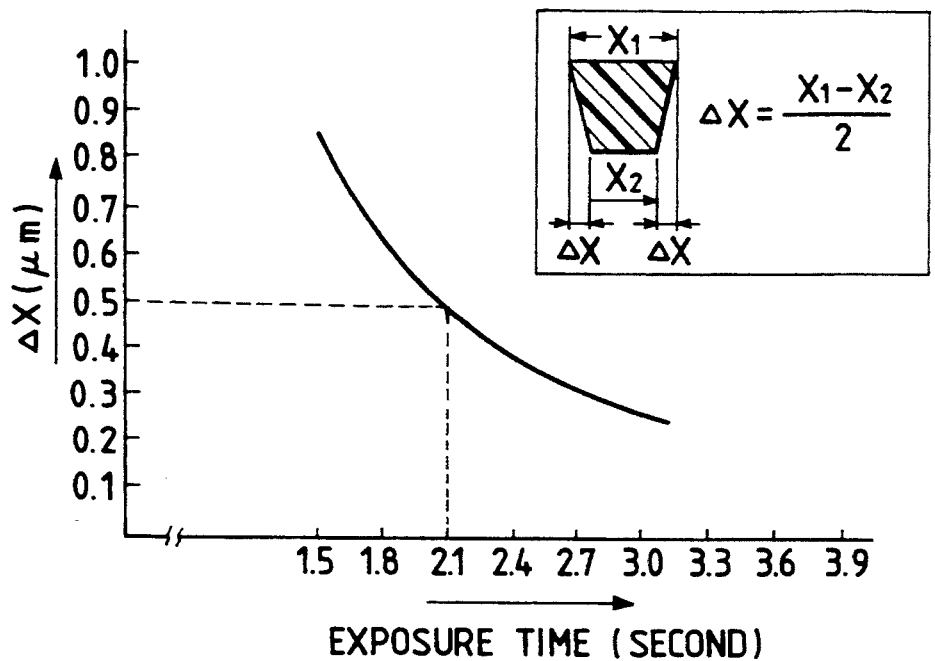
FIG. 3 is a characteristic diagram for indicating a relationship between the exposure times and the taper angles of the resist pattern.

As represented in FIG. 3, the taper angle of the resist pattern 14 (indicated by $\Delta X$ equal to a half of a difference between an upper-plane width $X_1$ of the resist pattern 14 and a lower-plane width $X_2$ thereof in this drawing) depends upon the exposure time in the exposure step shown in FIG. 2(a). That is to say, the shorter the exposure time becomes, the larger the taper angle becomes.

Figure 4:
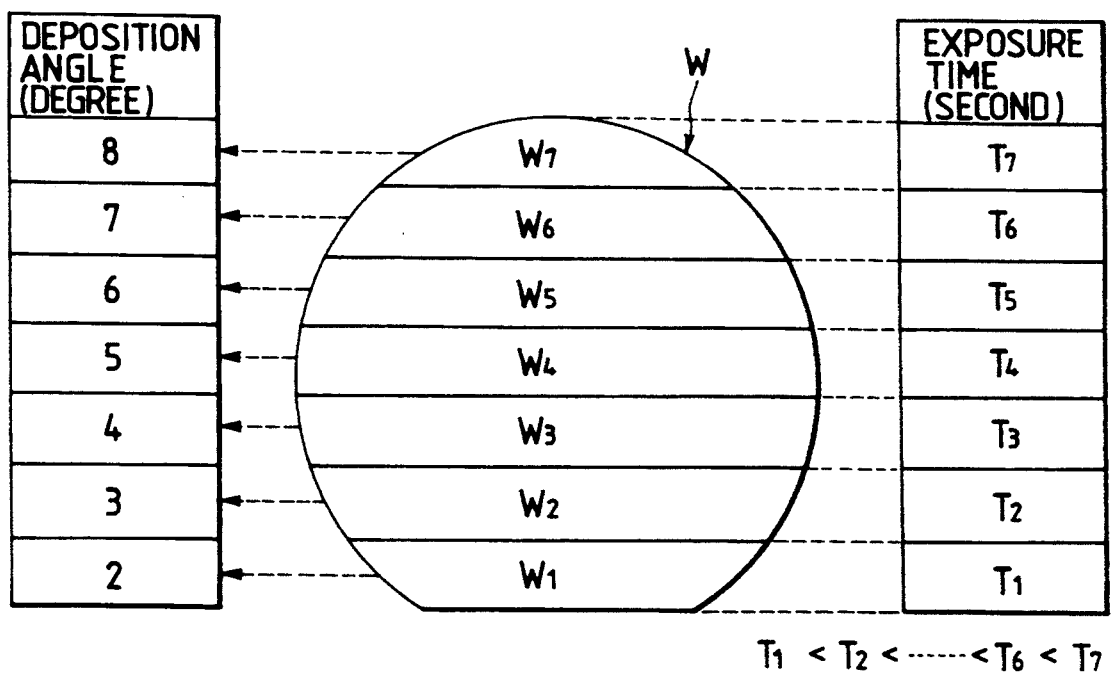
FIG. 4 illustrates a relationship among the vapor deposition angles and the exposure times in the various portions within the wafer plane.
Figure 7:
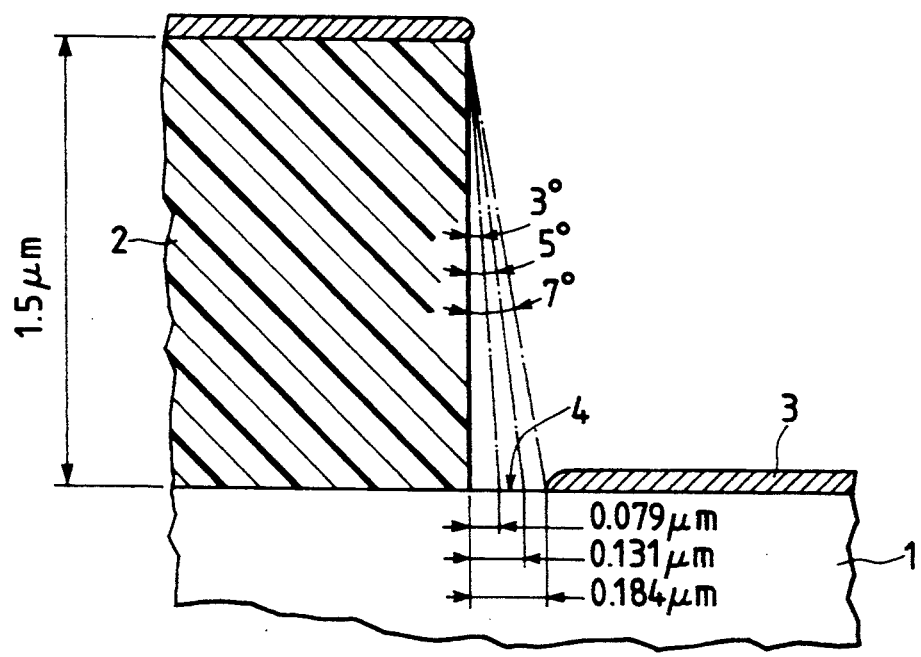
FIG. 7 is a sectional view for explaining the problems to be solved by the invention.

Referring now to FIG. 4, a description will be made of one example of a method for setting exposure time in connection with the continuous variation of the vapor deposition angle within the wafer. The overall wafer plane is subdivided into a plurality of regions $W_1$, $W_2$, - - -, $W_7$ for each change of the vapor deposition angle in unit of 1°, and also the exposure times $T_1$, $T_2$, - - -, $T_7$ are set to each of these subdivided regions in this preferred embodiment. In a concrete example, as explained in FIG. 7, there is a difference between the widths of the exposed regions 4 of the substrate, i.e., 0.105 (0.184–0.079) μm between the vapor deposition angles of 7° and 3°. Thus, the width of the exposed region 4 of the substrate is changed by approximately 0.026 μm per the change of vapor deposition angle of 1°. It is now assumed that the exposure time $T_4$ of the subdivided region $W_4$ whose vapor deposition angle is 5°, is set to 2.1 seconds. Thus, the shorter exposure time $T_3$ ($T_3 < T_4$) is set from the characteristic diagram shown in FIG. 3 in such a manner that the above-explained $\Delta X$ becomes longer by 0.026 μm since the width of the exposed region 4 of the substrate in the region $W_3$ whose vapor deposition angle is 4°, is narrower by 0.026 μm than the width of the region $W_4$ whose vapor deposition angle is 5°. Also, since the width of the exposed region 4 of the substrate at the region $W_5$ whose vapor deposition angle is 6° is wider by 0.026 μm than the width of the exposed region at the region $W_4$ whose vapor deposition angle is 5°, the longer exposure time $T_5$ ($T_4 < T_5$) is set from the characteristic diagram shown in FIG. 3 in such a manner that the above-explained $\Delta X$ becomes shorter by 0.026 μm. Subsequently, the exposure times $T_1$ to $T_7$ are continuously prolonged from the region whose vapor deposition angle is small to the region whose vapor deposition angle is large (from the regions $W_1$ to $W_7$), so that $\Delta X$ gradually becomes small.

Figure 5A:
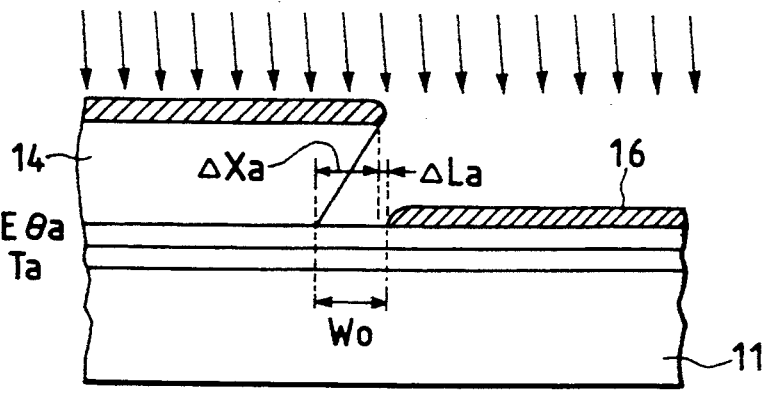
FIGS. 5(a) to 5(c) are sectional views for showing the conditions of the various portions within the wafer plane during the inclined vapor deposition.
Figure 5B:
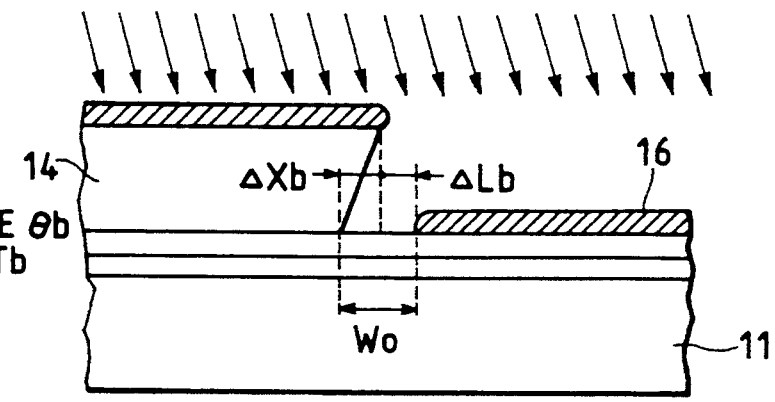
Figure 5C:
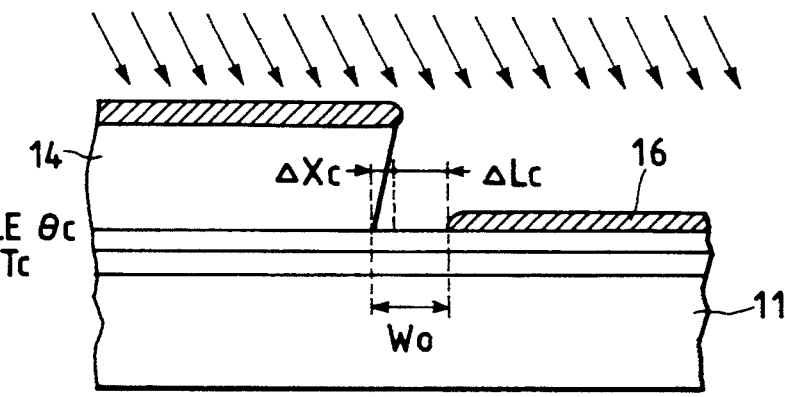
Figure 6:
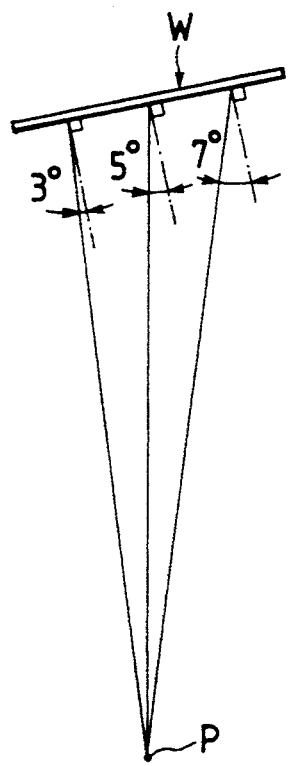
FIG. 6 illustrates variations in the vapor deposition angles within the wafer.

FIGS. 5(a) to 5(c) are sectional views for showing conditions of the various portions within the wafer during the inclined vapor deposition in the vapor deposition step represented in FIG. 1(c). In FIGS. 5(a) to 5(c), there is a relationship in the vapor deposition angles $\theta a$, $\theta b$, $\theta c$, namely $\theta a < \theta b < \theta c$, whereas there is another relationship in the exposure times Ta, Tb, Tc, namely $Ta < Tb < Tc$. In other words, since the exposure time is prolonged in such a manner that the taper angle of the resist pattern 14 becomes small as the vapor deposition angle becomes large, the widths of the exposed regions of the substrate defined from the side edge portion of the resist pattern 14 to the tip portion of the Ti film 16 is substantially constant. In this drawing, a relationship of $\Delta Xa + \Delta La = \Delta Xb + \Delta Lb = \Delta Xc + \Delta Lc = Wo$ can be substantially satisfied, and thus, the fine pattern having the substantially constant width can be obtained irrelevant to the angles of the inclined vapor deposition in the overall wafer.

It should be noted that the overall wafer plane has been subdivided for the change of the vapor deposition angle in unit of 1° and the exposure times with respect to the respective subdivided regions were varied in the above-described preferred embodiment. Alternatively, when the exposure times are varied for the change of the vapor deposition angle in unit of, for example, 0.5°, the variations in the pattern widths may be furthermore reduced.

Figure 2C:
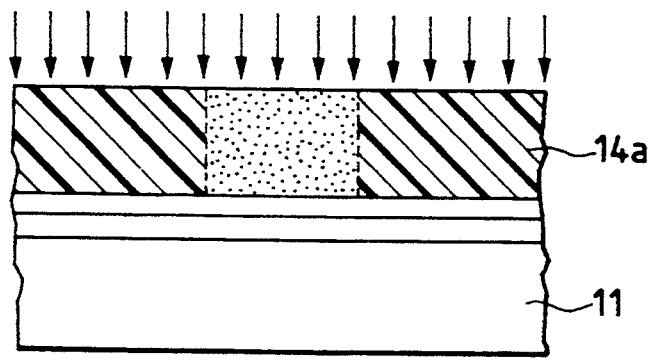
Figure 2D:
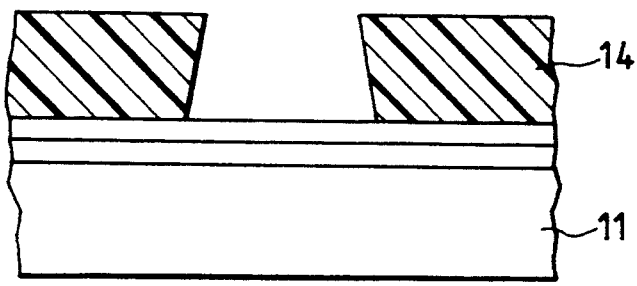

Moreover, although the exposure times were varied for each of the subdivided regions within the wafer plane in the above-described preexposure step as shown in FIG. 2(a) in the above-described preferred embodiment, the present invention is not limited thereto, but may be modified. For instance, while the exposure time is set to a constant in the preexposure step, the exposure time in the postexposure step as shown in FIG. 2(c) may be varied in order to change the taper angle of the resist pattern 14. In this case, the longer the exposure time at the postexposure step becomes, the larger the taper angle of the resist pattern 14 becomes.

As apparent from the above-described explanations, in accordance with the present invention, the exposure times of the photoresist are continuously varied within the water plane in relation to the continuous variations in the vapor deposition angles within the wafer plane during the inclined vapor deposition so as to change the taper angles of the resist pattern. As a consequence, the fluctuation in the pattern widths according to the variations in the vapor deposition angles can be compensated so that the very fine pattern with the constant width can be easily fabricated over the entire wafer plane.

What is claimed is:

1. A fine processing method comprising:
   forming a photoresist layer on the surface of a substrate in which a spaced pattern of fine openings is to be produced;
   exposing the photoresist layer to a radiation pattern in which the exposure changes in a given direction in the pattern;
   developing the photoresist layer to produce a pattern of spaced openings in the layer having taper angles which change with the change in exposure;
   depositing a film on the photoresist layer and in the spaced openings by inclined vapor deposition in which the angle of deposition changes in the given direction in accordance with the changing taper angles of the openings to produce a pattern of gaps having substantially the same width in the spaced openings in the photoresist layer; and
   etching the substrate in the pattern of openings exposed between the photoresist layer and the film to produce a spaced pattern of fine openings in the substrate having substantially the same width.

2. A fine processing method according to claim 1 wherein the exposure of the photoresist layer in the given direction in the pattern is changed by changing the exposure time.

3. A fine processing method according to claim 1 wherein the substrate surface has a plurality of different successive regions in the given direction corresponding to successive unit angle changes in the inclined vapor deposition angle and wherein the time of the exposure of the photoresist layer within each of the regions is determined in accordance with the relation between the exposure time and the taper angle of the resulting opening in the photoresist layer.

4. A fine processing method according to claim 1 wherein the photoresist layer contains an image-reversal positive photoresist of the type used in the manufacture of VLSI circuits.

* * * * *